United States Patent [19]

Wort et al.

[11] Patent Number: 4,735,699

[45] Date of Patent: Apr. 5, 1988

[54] METHODS OF DEPOSITING GERMANIUM CARBIDE

[75] Inventors: Christopher J. H. Wort, Towcester; Stuart P. Speakman, Chelmsford, both of England

[73] Assignee: Plessey Overseas Limited, Ilford, England

[21] Appl. No.: 868,909

[22] Filed: May 29, 1986

[30] Foreign Application Priority Data

Jun. 5, 1985 [GB] United Kingdom ............... 8514244

[51] Int. Cl.$^4$ ............................................. C23C 14/34
[52] U.S. Cl. ........................... 204/192.15; 204/192.16; 204/192.26; 204/192.28
[58] Field of Search ............... 204/192.15, 192.16, 204/192.17, 192.21, 192.22, 192.24, 192.25, 192.26, 192.27, 192.28, 192.29; 423/345, 346

[56] References Cited

U.S. PATENT DOCUMENTS 4,309,261 1/1982 Harding et al. ............... 204/192.15
4,525,417 6/1985 Dimigen et al. ........... 204/192.15 X
4,591,418 5/1986 Snyder .......................... 204/192.16

Primary Examiner—John F. Niebling
Assistant Examiner—Nam X. Nguyen
Attorney, Agent, or Firm—Michael F. Oglo; Julian C. Renfro

[57] ABSTRACT

A prior art method of depositing Germanium Carbide involves the use of glow discharge techniques which are problematic in that they require high substrate temperatures. Methods embodying the present invention comprise exposing a target of germanium to a plasma comprising an inert gas and a halocarbon gas. The plasma is maintained by means of a radio frequency magnetron electrode which is associated with the target. Atoms and ions of Germanium and Carbon are sputtered onto the substrate in order to deposit the Germanium Carbide.

4 Claims, 1 Drawing Sheet

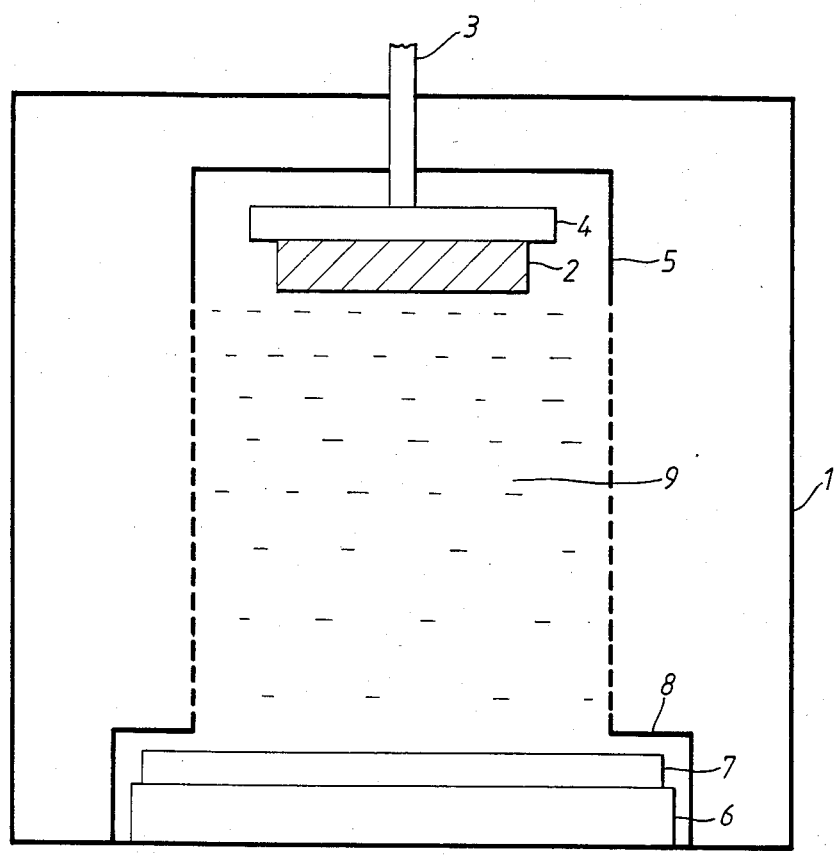

METHODS OF DEPOSITING GERMANIUM CARBIDE

TECHNICAL FIELD

This invention relates to methods of depositing Germanium Carbide, and in particular to methods which involve reactive radio frequency magnatron sputtering techniques.

BACKGROUND OF THE INVENTION

A previously proposed method of depositing Germanium Carbide involves the use of glow discharge techniques. Such techniques are disadvantageous in that they require high substrate temperatures, i.e. above 500° Centigrade, and hydrocarbon gasses, and deposition of the Germanium Carbide is relatively slow. Due to the high substrate temperatures, the Germanium Carbide deposited by such methods is subjected to high stresses as a result of differing coefficients of expansion between the substrate on which the Germanium Carbide is deposited and the Germanium Carbide itself. When the Germanium Carbide is subjected to such stresses, the infra-red absorption coefficient of the Germanium Carbide is increased. Further, the unwanted stress imposes limitations on the thickness of the Germanium Carbide which can be usefully deposited.

OBJECT OF THE INVENTION

It is an object of the present invention to provide a method which permits relatively fast deposition of thicker layers of Germanium Carbide at lower substrate temperatures.

SUMMARY OF THE INVENTION

According to the present invention, there is provided a method of depositing Germanium Carbide on a substrate, the method comprising exposing a target of Germanium to a plasma comprising an inert gas and a halocarbon gas, maintaining the plasma by means of a radio frequency magnetron electrode, which is associated with the target, sputtering atoms and ions of Germanium and Carbon onto the substrate in order to deposit the Germanium Carbide.

The method according to the present invention is particularly advantageous in that the use of the halocarbon avoids the high substrate temperature requirement which is necessary, when using a hydrocarbon gas, to drive out hydrogen from any germanium Hydrogen Carbide formed. Also, use of a halocarbon avoids Germanium-hydrogen or carbon-hydrogen bonding which bonding lowers the infra-red absorption of the Germanium Carbide deposited.

The inert gas is preferably Argon and the halocarbon is preferably a fluorocarbon such as carbon tetrafluoride ($CF_4$).

The composition of Germanium Carbide preferably consists of 75% Germanium and 25% Carbon. The aforementioned composition is expressed in terms of atomic percentages and it is understood that variations of the particular atomic percentages quoted may also provide the advantages afforded by the present invention. Consequently, it is intended that such variations fall within the scope of the present invention.

BRIEF DESCRIPTION OF THE DRAWING

The invention will now be further described by way of example with reference to the accompanying drawing, in which there is shown a schematic diagram of an apparatus suitable for performing a method embodying the present invention.

DETAILED DESCRIPTION OF THE INVENTION

In the drawing there is shown a vacuum chamber 1 in which Germanium Carbide is to be deposited on a substrate 2. A vacuum feed-through 3 provides power for electrically heating a heater 4 which in turn heats the substrate 2 on which the Germanium Carbide is deposited. A shield 5 surrounds part of the substrate and is electrically connected to earth in order to confine deposition to the substrate 2.

At an end of the vacuum chamber 1 remote from the substrate 2, there is provided a radio frequency magnetron electrode 6, which electrode 6 may be water cooled, on which is located a target 7 of Germanium. A target shield and anode ring 8 is provided around part of the target 7 and the radio frequency magnetron electrode 6 in order to define an area of the target 7 which is to be eroded.

When the apparatus is in use, the radio frequency magnetron electrode 6 is switched on to provide sufficient power to maintain a plasma 9 between the substrate 2 and the Germanium target 7. The plasma 9 comprises an inert gas, in this case Argon, and a reactive gas, in this case a "halocarbon" such as carbon tetrafluoride ($CF_4$).

A "halocarbon" is any of a series of compounds of one or more of the halogens and carbon, a particular example being carbon tetrafluoride.

The plasma 9 sputters the Germanium target 7 and causes Germanium ions to be ejected from the target 7 and to pass through the plasma 9 to the substrate 2. Electrons which are left due to the production of Germanium ions are confined in the region of the target 7 by the magnetic field produced by the magnet of the magnetron electrode 6. Any build up of electronic charge drains away to earth via the target shield and anode ring 8.

By controlling the ratio of Argon and halocarbon fed into the vacuum chamber 1, the composition of Germanium Carbide formed on the substrate 2 can be carefully controlled. By depositing the Germanium Carbide by this method, higher depositon rates can be achieved. In addition, the temperature of the substrate may be maintained at a relatively low temperature of, for example, of less than 300° Centigrade. Consequently, the thickness of the deposit of Germanium Carbide may be increased ten fold or more. Use of the radio frequency magnetron electrode 6 has an additional advantage that secondary electron bombardment of the substrate 2 is reduced due to the fact that electrons produced at the target 7 are confined to the region of the target shield and anode ring 8.

Germanium Carbide produced according to a method embodying the present invention has special properties in that it is harder than pure Germanium, and it has an infra-red absorption coefficient which increases with temperature to a lesser degree than the pure element Germanium.

We claim:

1. A method of depositing Germanium Carbide on a substrate, the method comprising exposing a target of Germanium to a plasma comprising an inert gas and a halocarbon gas, maintaining the plasma by means of a radio frequency magnetron electrode which is associated with the target, and sputtering atoms and ions of Germanium and Carbon onto the substrate in order to deposit Germanium Carbide having an infra-red absorption co-efficient for enabling the Germanium Carbide to be used as an infra-red window material.

2. A method according to claim 1 wherein the inert gas is Argon and the halocarbon gas is carbon tetrafluoride.

3. A method according to claim 2 wherein the Germanium Carbide has a composition comprising 75% Germanium and 25% carbon.

4. A method according to claim 1 wherein the Germanium Carbide has a composition comprising 75% Germanium and 25% Carbon.

* * * * *